United States Patent [19]

Yajima et al.

[11] 4,151,542
[45] Apr. 24, 1979

[54] TRANSISTOR

[75] Inventors: Kazuo Yajima; Masaaki Kobayashi, both of Kawasaki; Yoshiaki Nawata, Yokohama; Shigeo Iwasawa, Hayama; Koji Takahashi, Kamakura, all of Japan

[73] Assignee: Fujitsu Limited, Japan

[21] Appl. No.: 875,917

[22] Filed: Feb. 7, 1978

[30] Foreign Application Priority Data

Feb. 7, 1977 [JP] Japan .................................. 52-12678

[51] Int. Cl.$^2$ ........................................... H01L 29/72
[52] U.S. Cl. ....................................... 357/36; 357/34; 357/46; 357/51
[58] Field of Search ....................... 357/34, 36, 46, 51

[56] References Cited

U.S. PATENT DOCUMENTS

| 3,958,267 | 5/1976 | Frederiksen et al. | 357/36 |
| 3,988,759 | 10/1976 | Denning et al. | 357/36 |

*Primary Examiner*—Edward J. Wojciechowicz
*Attorney, Agent, or Firm*—Staas & Halsey

[57] ABSTRACT

A transistor which has a plurality of ring emitter transistor units formed on a common semiconductor substrate having one conductivity type, each ring emitter transistor unit being provided with a base region of the opposite conductivity type from the semiconductor substrate and formed on its surface, an emitter region of the same conductivity type as the semiconductor substrate and formed in the base region to a depth smaller than the latter to have a ring-shaped plane configuration, a base electrode formed in the vicinity of the outer or inner periphery of the ring-shaped emitter region, an emitter electrode formed in the vicinity of the inner or outer periphery of the emitter region, and a ballasting resistor formed to interconnect the emitter region and the emitter electrode. The product of the area of the emitter region and the resistance value of the ballasting resistor is selected to be in the range of from $6.0 \times 10^{-4}$ to $1.3 \times 10^{-3}$ [$\Omega \cdot cm^2$], to provide for enhanced power handling capability of the transistor without a large reduction in its maximum current and to facilitate the design of this kind of transistor.

2 Claims, 5 Drawing Figures

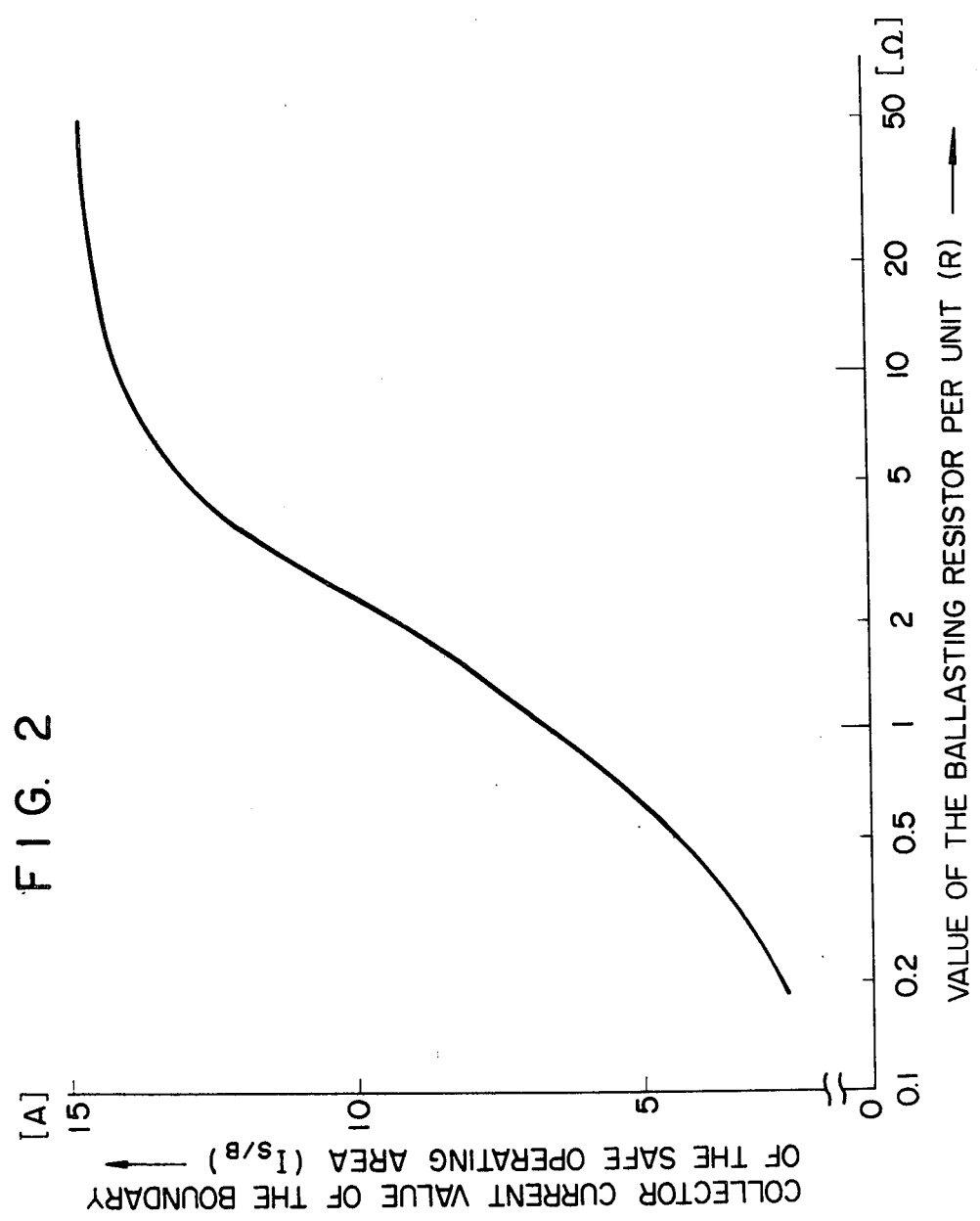

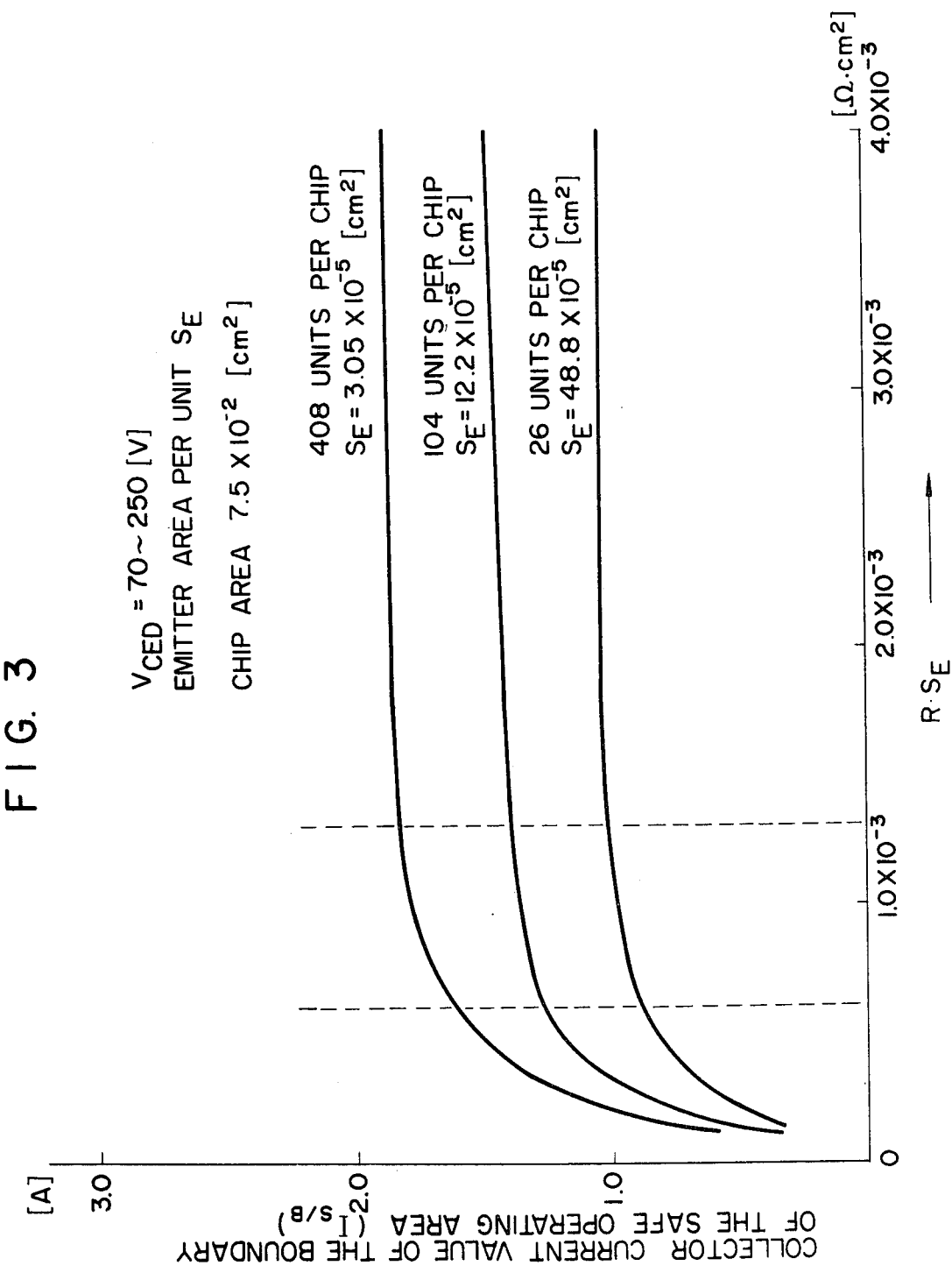

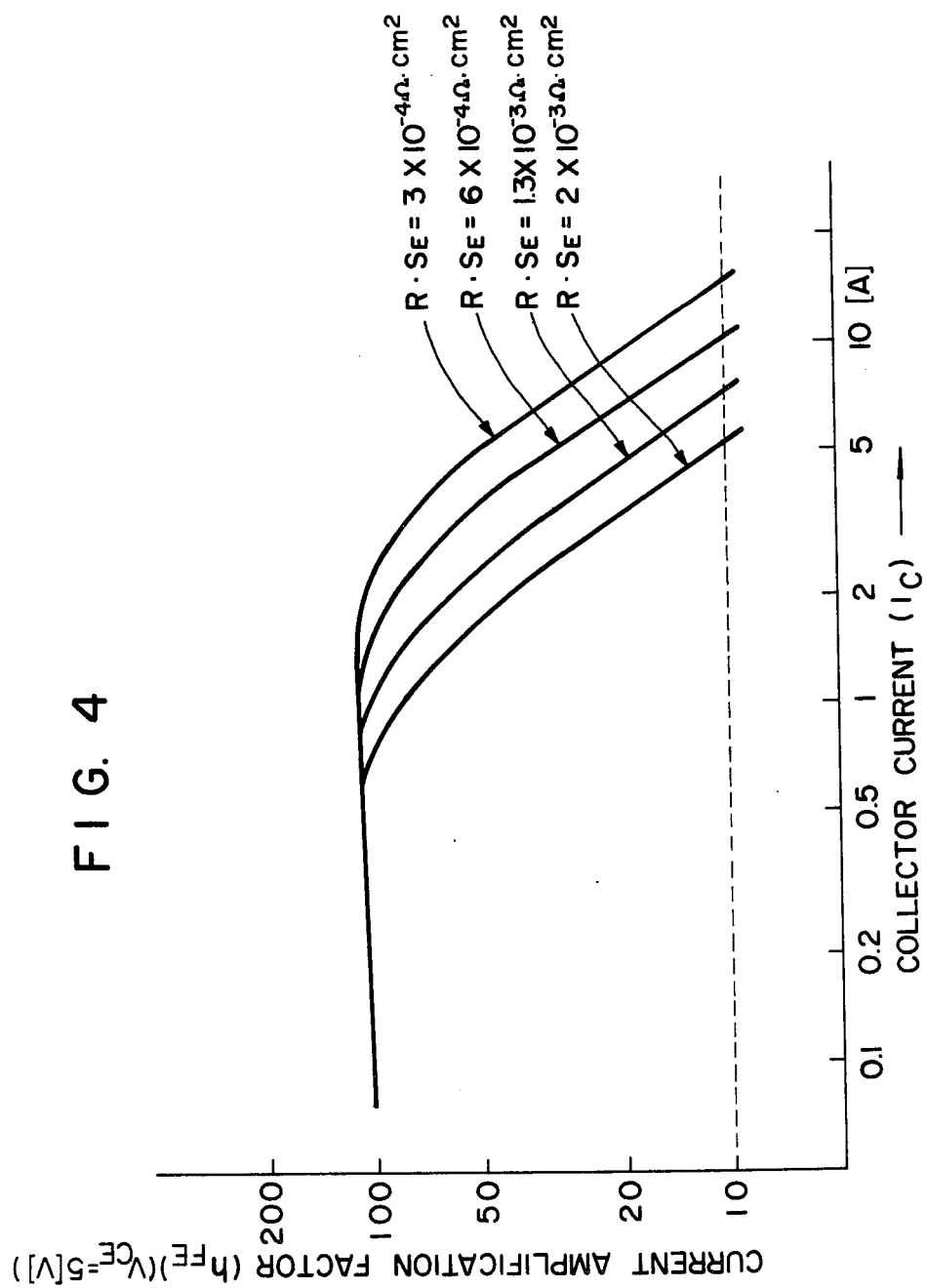

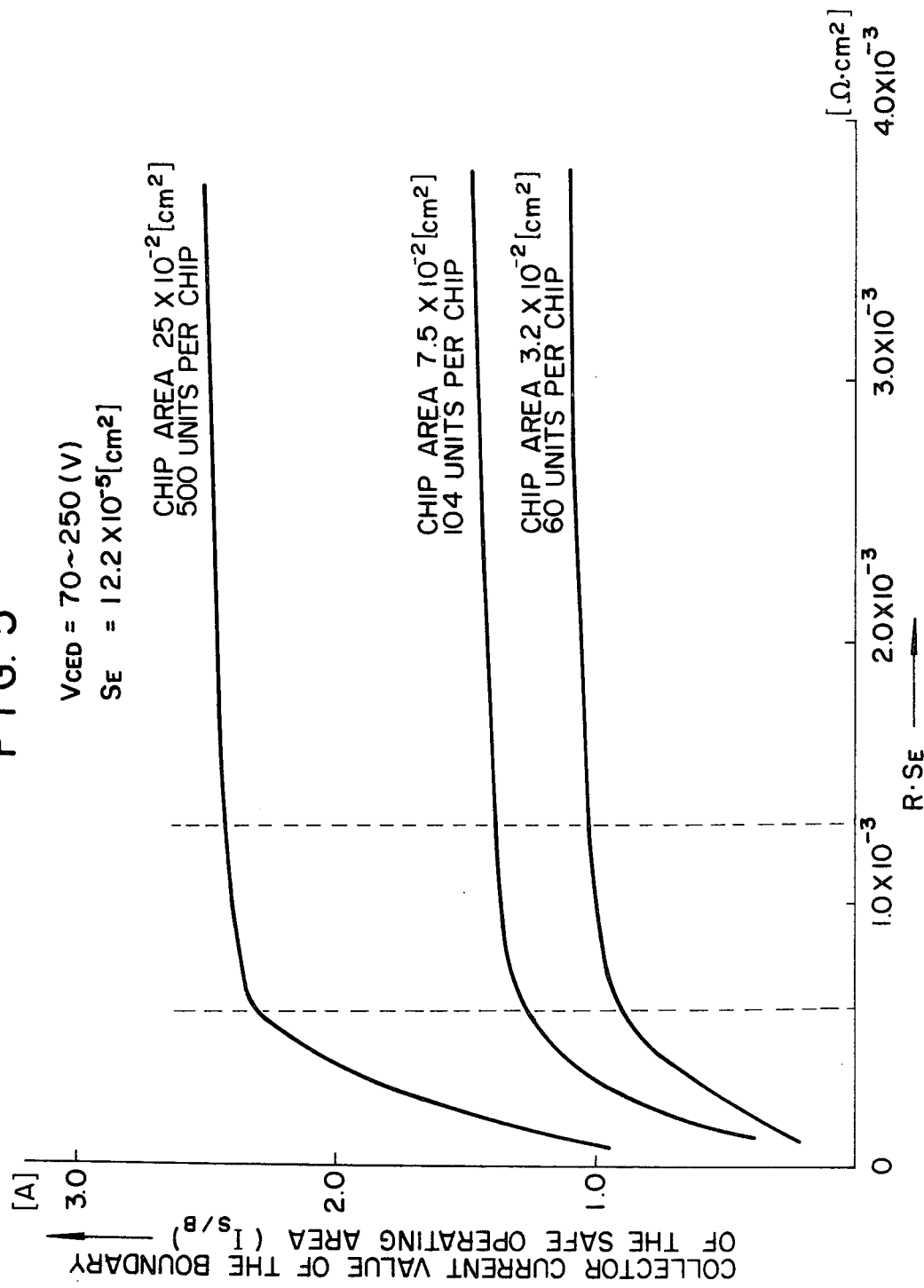

TRANSISTOR

BACKGROUND OF THE INVENTION

1. Field of the Invention

This invention relates to a semiconductor device, and more particularly to a transistor structure having a ring-shaped emitter region formed in a base region.

2. Description of the Prior Art

There has recently been developed the so-called ring emitter transistor which has a ring-shaped emitter region. FIG. 1 shows in perspective one part of such a transistor. In FIG. 1, reference numeral 1 indicates a silicon semiconductor substrate; 2 designates an epitaxial layer formed on the substrate, which layer is a collector region; and 3 identifies a base region formed on the collector region. The base region 3 has formed therein a plurality of base electrode forming regions 4 which have a higher impurity concentration than the base region 3 and which are interconnected through aluminum (Al) wiring layers for wiring base electrodes, though not shown. In the base region 3, a plurality of ring-shaped emitter regions 5 are formed and an emitter electrode forming region 6 is formed substantially centrally of each ring-shaped emitter region 5 and, further, the emitter region 5 and the emitter electrode forming region 6 are interconnected through an impurity diffused region 7 having a relatively high resistance and serving as a ballasting resistor. The emitter electrode forming regions 6 are interconnected through aluminum wiring layers for wiring emitter electrodes.

The transistor of such a construction is fabricated as an integrated circuit with a plurality of parallel connected ring emitter transistor units. Each of the transistor units are electrically equivalent to one another and have substantially the same electrical properties. Since the transistor units can be actuated to perform uniform operation through the ballasting resistors individually provided for the units, it is possible to obtain a large power output from the transistor while retaining the high-speed operability of a small-power unit, and to retain excellent power handling capability, too. If the value of the ballasting resistor provided for each ring emitter transistor unit as described above is small, the negative feedback action of the ballasting resistor decreases to lessen its effect. With a large resistance value, however, there occurs such an incompatible phenomenon that the power handling capability increases, whereas a maximum current, for example, a maximum collector current providing a current amplification factor $h_{FE} = 10$, decreases. Accordingly, in the actual transistor design, it is difficult to set the value of the ballasting resistor.

SUMMARY OF THE INVENTION

This invention provides a novel transistor which is free from the abovesaid defects of the prior art and which has a sufficient power handling capability and is provided with ballasting resistors of an optimum value which does not cause a decrease in the maximum current.

The above object is achieved by providing a transistor which has a plurality of ring emitter transistor units formed on a common semiconductor substrate having one conductivity type, each ring emitter transistor unit comprising a base region of the opposite conductivity type from the semiconductor substrate and formed on its one surface, an emitter region of the same conductivity type as the semiconductor substrate and formed in the base region to a depth smaller than the latter to have a ring-shaped plane configuration, a base electrode formed in the vicinity of the outer or inner periphery of the ring-shaped emitter region, an emitter electrode formed in the vicinity of the inner or outer periphery of the emitter region, and a ballasting resistor formed to interconnect the emitter region and the emitter electrode. The product of the area of the emitter region and the resistance value of the ballasting resistor is selected to be in the range from $6.0 \times 10^{-4}$ to $1.3 \times 10^{-3}$ $[\Omega \cdot cm^2]$.

BRIEF DESCRIPTION OF THE DRAWINGS

FIG. 2 is a graph showing the relationship between the resistance value of a ballasting resistor and a current value Is/B in the ring emitter transistor unit;

FIG. 3 is a graph showing the relationship between a value $R \cdot S_E$ and the current value Is/B in the ring emitter transistor unit;

FIG. 4 is a graph showing the relationship between the collector current Ic and the current amplification factor $h_{FE}$ in the ring emitter transistor unit; and FIG. 5 is a graph showing the relationship between the value $R \cdot S_E$ and the current value Is/B in the ring emitter transistor unit.

DESCRIPTION OF THE PREFERRED EMBODIMENTS

Figure 1:
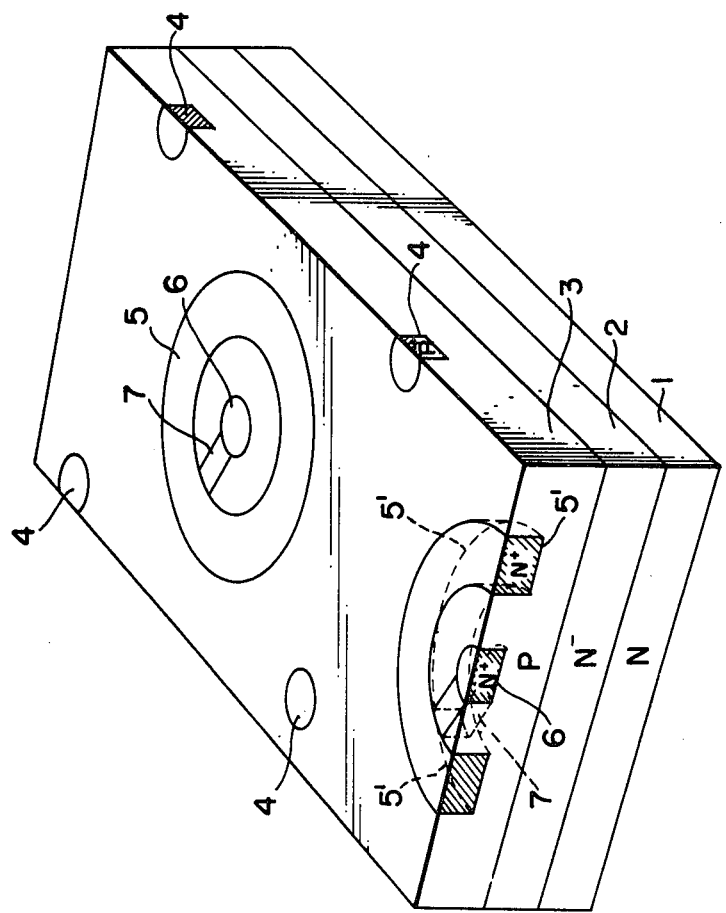
FIG. 1 is a perspective view showing a ring emitter transistor unit.

FIG. 2 is a graph showing variations in the current value Is/B of the boundary of the safe operating area which were caused by changing the value of the ballasting resistor inserted in an emitter circuit in the case where 104 ring emitter transistor units were provided side by side and the area $S_E$ of the emitter region (hereinafter referred to as the emitter area) of each ring emitter transistor unit was $1.2 \times 10^{-4}$ $[cm^2]$. The data shown in FIG. 2 were obtained in the case where a DC voltage of 50 [V] was applied between the collector and emitter of the transistor measured and an input signal having a pulse width of 10 [ms] and a duty of 2 [%] was applied to an input circuit. It appears from FIG. 2 that the value of the ballasting resistor gradually increases from 0.2 $[\Omega]$, the current value of the boundary of the safe operating area also increases gradually and that when the value of the ballasting resistor becomes large to some extent, the increase in the current value of the boundary of the safe operating area becomes flat. Accordingly, in the case of FIG. 2, a value of 10 $[\Omega]$ or larger will suffice for the ballasting resistor but since an increase in the resistance value causes a decrease in the maximum current, as described above, it is impossible to increase the resistance value without any restriction. For example, if the emitter area is made twice as large, the emitter current substantially doubles, so that the value of the ballasting resistor may be reduced by half. From such facts, the present inventors noticed the interrelationship between the value of the ballasting resistor and the emitter area, and conducted many experiments. Their experiments reveal that an optimum resistance value, which does not cause a large decrease in the maximum current while maintaining the power handling capability of the transistor at a satisfactory value, is given by the product of the emitter area $S_E$ and the resistance value.

FIG. 3 shows some of such experimental results, illustrating variations in the current value Is/B of the boundary of the safe operating area caused in response to various changes in the product $R \cdot S_E$ of the emitter area $S_E$ and the value R of the ballasting resistor in the ring emitter transistor unit. The data shown in FIG. 3 were measured under the conditions that the area of each silicon semiconductor chip was $7.5 \times 10^{-2}$ [cm$^2$], that the number of transistor units per chip were 26 units, 104 units and 408 units, respectively, that the emitter areas $S_E$ were $48.8 \times 10^{-5}$ [cm$^2$], $12.2 \times 10^{-5}$ [cm$^2$] and $3.05 \times 10^{-5}$ [cm$^2$], respectively, that a DC operating voltage of 50 [V] was applied between the collector and emitter of the ring emitter transistor having a voltage $V_{CEO}$ of 70 to 250 [V] and that an input signal having a pulse width of 10 [ms] and a duty of 2 [%] was applied to the input side.

As is apparent from FIG. 3, even if the unit area of the emitter region is altered, as the value of the product $R \cdot S_E$ of the ballasting resistor and the emitter area gradually increases from $1 \times 10^{-4}$ [$\Omega \cdot$cm$^2$], the collector current Is/B of the bondary of the safe operating area increases but the increase starts to become less sharp at about $6.0 \times 10^{-4}$ [$\Omega \cdot$cm$^2$]. And when the value of the product reaches $2.0 \times 10^{-3}$ [$\Omega \cdot$cm$^2$], the collector current increases no further but becomes constant.

FIG. 4 shows how the maximum current varies with variations in the product $R \cdot S_E$ in the same transistors as those used for obtaining the data depicted in FIG. 3.

It appears from FIG. 4 that the collector current, in the case of the current amplification factor $h_{FE}$ dropping to 10, decreases with an increase in the product $R \cdot S_E$. For instance, in the cases of the product $R \cdot S_E$ being $1.3 \times 10^{-3}$ and $2 \times 10^{-3}$ [$\Omega \cdot$cm$^2$], respectively, the collector currents were respectively 7/10 and ½ of that in the case of the product $R \cdot S_E$ being $6 \times 10^{-4}$ [$\Omega \cdot$cm$^2$].

The above experimental data were obtained with a ring emitter transistor unit having a chip area of $7.5 \times 10^{-2}$ [cm$^2$] and wherein the emitter had a perfectly round ring-shaped configuration. But even when the emitter was deformed so as to be square or hexagonal and even when the area of the chip was somewhat altered, the experimental results were substantially the same as those described above.

FIG. 5 shows some of such experimental results, illustrating variations in the current value Is/B of the boundary of the safe operating area caused by altering the product $R \cdot S_E$ of the value R of the ballasting resistor and the emitter area in the case where the area of the chip of the ring emitter transistor was changed.

The data shown in FIG. 5 were measured in connection with ring emitter transistors wherein the area of each emitter was $12.2 \times 10^{-5}$ [cm$^2$], the voltage $V_{CEO}$ was in the range of 70 to 250 [V] and wherein 60, 104 and 500 transistor units were formed on silicon semiconductor chips having areas of $3.2 \times 10^{-2}$ [cm$^2$], $7.5 \times 10^{-2}$ [cm$^2$] and $25 \times 10^{-2}$ [cm$^2$], respectively, and under the same conditions as those employed for obtaining the data depicted in FIG. 3.

As is evident from FIG. 5, even if the area of the semiconductor chip used is altered, as the value of the product $R \cdot S_E$ of the resistance value of the ballasting resistor and the emitter area gradually increases from a value of $1 \times 10^{-4}$ [$\Omega \cdot$cm$^2$], the collector current Is/B of the boundary of the safe operating area increases but the increase starts to become less sharp when the product reaches a value of about $6.0 \times 10^{-4}$ [$\Omega \cdot$cm$^2$]. And after a value of $2.0 \times 10^{-3}$ [$\Omega \cdot$cm$^2$] is reached, the collector current increases no further and becomes a substantially constant value.

In the ring emitter transistor unit used, the base electrode forming regions were formed outside of the emitter region and the emitter electrode forming region was inside of the emitter region, as depicted in FIG. 1. Experiments were also carried out on a ring emitter transistor unit having the base electrode forming region provided inside of the emitter region and the emitter electrode forming region outside of the emitter region, but the experimental results obtained were substantially the same as those mentioned above.

The above experimental results are summarized as follows: From the experimental results shown in FIGS. 3 and 4, it is concluded that the product $R \cdot S_E$ of the value R of the ballasting resistor and the emitter area $S_E$ be selected to be in the range of about $6 \times 10^{-4}$ to about $1.3 \times 10^{-3}$ [$\Omega \cdot$cm$^2$] at which point the collector current value in the case of the current amplification factor $h_{FE}$ dropping to 10 is 7/10 or so of the collector current value in the case of the product $R \cdot S_E$ being $6 \times 10^{-4}$ [$\Omega \cdot$cm$^2$].

As described in detail above, according to this invention, once the emitter area of the ring emitter transistor unit is determined at the stage of design, it is sufficient only to select the value of the ballasting resistor such that the value of the product of the emitter area and the value of the ballasting resistor may be in the abovesaid range. This facilitates the design of the ring emitter transistor unit. Further, this invention provides a transistor which has sufficient power handling capability and does not suffer from a large decrease in its maximum current.

It will be apparent that many modifications and variations may be effected without departing from the scope of the novel concepts of this invention.

In the present invention, many modifications may be effected without departing from what is defined by the appended claim. For example, the emitter region is described and shown to have a circular ring configuration but can also be formed easily to have a square ring configuration or a square one having its corners rounded off or a polygonal ring configuration.

What is claimed is:

1. A transistor having a plurality of ring-shaped emitter transistor units formed on a common semiconductor substrate of one conductivity type, each of said plurality of ring-shaped emitter transistor units comprising a base region of the opposite conductivity type from that of the semiconductor substrate and formed on one surface thereof, an emitter region of the same conductivity type as that of the semiconductor substrate and formed in the base region to a depth less than that of the base region and having a ring-shaped plane configuration, a base electrode formed in the vicinity of one periphery of the ring-shaped emitter region, an emitter electrode formed in the vicinity of the other periphery of the ring-shaped emitter region, and a ballasting resistor formed to interconnect the emitter electrode and the emitter region wherein the product of the area of the emitter region and the resistance value of the ballasting resistor of each ring-shaped emitter transistor unit is selected to be in the range of from $6.0 \times 10^{-4}$ to $1.3 \times 10^{-3}$ [$\Omega \cdot$cm$^2$].

2. A method of manufacturing a transistor having a plurality of ring-shaped emitter transistor units formed on a common semiconductor substrate of one conductivity type, comprising the steps of:

(a) providing for each of the plurality of transistor units a base region of the opposite conductivity type from that of the common semiconductor substrate and formed on one surface thereof;

(b) providing for each of the plurality of transistor units an emitter region of the same conductivity as that of the common semiconductor substrate and formed in the base region to a depth less than that of the base region and having a ring shaped plane configuration;

(c) providing for each of the plurality of transistor units a base electrode formed in the vicinity of one periphery of the ring-shaped emitter region and an emitter electrode formed in the vicinity of the other periphery of the ring-shaped emitter region;

(d) providing for each of the plurality of transistor units a ballasting resistor formed to interconnect the emitter electrode and the emitter region, wherein the product of the area of the emitter region and the resistance value of the ballasting resistor of each ring-shaped emitter transistor unit is selected to be in the range of from $6 \times 10^{-4}$ to $1.3 \times 10^3$ ohm $-cm^2$, whereby the resistance value of the ballasting resistor of each ring-shaped emitter transistor unit is large enough to insure that the boundary value of the collector current of the safe operating area of each transistor unit is not substantially below its maximum value, and whereby the resistance value of the ballasting resistor of each ring-shaped emitter transjstor unit is small enough to insure that the collector current of each transistor unit at a predetermined transistor gain is not below 70% of the value of the collector current when the ballasting resistor has a value equal to $6 \times 10^{-4}$ ohm $-cm^2$ divided by the area of the emitter region in $cm^2$.

* * * * *